United States Patent
Murakami

Patent Number: 5,440,588
Date of Patent: Aug. 8, 1995

[54] METHOD AND APPARATUS FOR ESTIMATING MAXIMUM LIKELIHOOD SEQUENCE IN DIGITAL COMMUNICATION RECEIVER WITH REDUCED REAL TIME CALCULATIONS

[75] Inventor: Junzo Murakami, Kanagawa, Japan

[73] Assignee: Kabushiki Kaisha Toshiba, Kawasaki, Japan

[21] Appl. No.: 36,687

[22] Filed: Mar. 25, 1993

[30] Foreign Application Priority Data

Mar. 25, 1992 [JP] Japan ................................. 4-067191

[51] Int. Cl.$^6$ ............................................. H03D 1/06
[52] U.S. Cl ........................................ 375/341; 371/43; 375/346; 375/348; 375/284; 375/285
[58] Field of Search ................. 371/43; 375/57, 58, 375/94, 99, 101

[56] References Cited

U.S. PATENT DOCUMENTS 5,272,726  12/1993  Furuya et al. ........................ 371/43

Primary Examiner—Stephen Chin
Assistant Examiner—William Luther
Attorney, Agent, or Firm—Oblon, Spivak, McClelland, Maier & Neustadt

[57] ABSTRACT

A maximum likelihood sequence estimation capable of reducing an amount of real time calculations involved and improving a high speed follow up characteristic. N-dimensional vectors corresponding to all possible transmission sequence candidates of a prescribed length, which are pre-calculated according to a prescribed definition, are stored in a memory. Then, an estimated received signal for each one of the branches at the present sampling time is obtained by calculating an inner product of one of the N-dimensional vectors stored in the memory corresponding to each transmission sequence candidate resulting from each one of the branches reaching to each state at the present sampling time with the N-dimensional received signal vector for the present sampling time obtained from at least N received signals for at least N previous sampling times. The maximum likelihood sequence can be estimated as a survivor path for each state at the present sampling time according to this estimated received signal as usual.

20 Claims, 3 Drawing Sheets

METHOD AND APPARATUS FOR ESTIMATING MAXIMUM LIKELIHOOD SEQUENCE IN DIGITAL COMMUNICATION RECEIVER WITH REDUCED REAL TIME CALCULATIONS

BACKGROUND OF THE INVENTION

1. Field of the Invention

The present invention relates to an estimation of a maximum likelihood sequence to be utilized in a digital communication receiver.

2. Description of the Background Art

In general, a digital communication receiver is required to recover the transmitted codes correctly from the received signals affected by the transmission distortion and the noises, by means of some signal processing.

One of the known method to achieve this correct recovery of the transmitted codes is the maximum likelihood sequence estimation using the Viterbi algorithm. In this method, when the received signal sequence is given, the transmission code sequence which makes the best matching with the received signal sequence is selected from all the conceivable transmission code sequence candidates. Here, the Viterbi algorithm is utilized in order to reduce the amount of calculations involved in this process.

This maximum likelihood sequence estimation assumes that the transmission path response is known in advance, while the transmission path response itself can be measured only when the transmission signals are known. In this respect, in the mobile radio communication such as an automobile telephone, the transmission path response constantly changes in time, so that it becomes necessary to carry out the transmission sequence estimation and the transmission path response estimation alternately and repeatedly, in order to follow such a constantly changing transmission path response. Such a procedure for the maximum likelihood sequence estimation has been called a transmission path adaptive maximum likelihood sequence estimation scheme, or more simply, an adaptive maximum likelihood sequence estimation scheme.

Conventionally, the following method has been known as an example of the adaptive maximum likelihood sequence estimation scheme capable of realizing a superior high speed follow up characteristic.

Namely, a conventional apparatus to be provided in a digital communication receiver for realizing this method has a configuration as shown in FIG. 1, which comprises: an input terminal 4 for entering a received baseband signal r(t); a sampling circuit 15 connected to the input terminal 4; a received signal memory 12 connected to the sampling circuit 15; a processing control unit 16 connected to the received signal memory 12; a matrix memory 11 connected to the processing control unit 16; and a path memory 13 connected to the processing control unit 16.

In this apparatus of FIG. 1, first, the received baseband signal r(t) entering at the input terminal 4 is sampled by a sampling circuit 15 at the sampling period equal to a transmission symbol period T. In the following, the time will be expressed in units of this transmission symbol period T, where k is an ordered number.

Also, the transmission path response is simulated by a transversal filter with a tap interval T and a tap number L, which is expressed by an L-dimensional vector h(k) defined by the following expression (1) in terms of a sequence of tap gains as elements.

$$h(k) = [h_0, h_1, \ldots, h_{L-1}]^t \qquad (1)$$

where $t$ denotes the transpose.

In addition, each transmission code is assumed to be Q-valued, and a transmission signal vector s(k) comprising L symbols of such Q-valued transmission codes, a received signal vector r(k) comprising N samples of received signals corresponding to the transmission signal vector s(k), and a noise vector n(k) representing noise components in the received signal vector r(k) are defined by the following expressions (2) to (4), respectively.

$$s(k) = [s_k, s_{k-1}, \ldots, s_{k-L+1}]^t \qquad (2)$$

$$r(k) = [r_k, r_{k-1}, \ldots, r_{k-N+1}]^t \qquad (3)$$

$$n(k) = [n_k, n_{k-1}, \ldots, n_{k-N+1}]^t \qquad (4)$$

Furthermore, an N×L transmission signal matrix S(k) comprising N transmission signal vectors ranging from $s^t(k)$ to $s^t(k-N+1)$ is defined by the following expression (5).

$$S(k) = \begin{pmatrix} s^t(k) \\ s^t(k-1) \\ \ldots \\ s^t(k-N+1) \end{pmatrix} = \begin{pmatrix} s_k & s_{k-1} & \cdots & s_{k-L+1} \\ s_{k-1} & s_{k-2} & \cdots & s_{k-L} \\ \cdots & & & \\ s_{k-N+1} & s_{k-N} & \cdots & s_{k-L-N+2} \end{pmatrix} \qquad (5)$$

Then, the following transmission path equation (6) holds in this case.

$$r(k) = S(k) h(k) + n(k) \qquad (6)$$

Here, even when S(k) and r(k) are known in advance, n(k) cannot possibly be known in advance, so that the transmission path response h(k) cannot be derived from this equation (6) directly. On the other hand, however, it is possible to derive the transmission path response h(k) which minimizes an evaluation function E(k) defined by the following expression (7), directly from the above equation (6).

$$E(k) = \sum_{i=-N+1}^{0} |e_{k+i}|^2 \qquad (7)$$

$$= \sum_{i=-N+1}^{0} e_{k+i}^* e_{k+i}$$

$$= [S(k) h(k) - r(k)]^{*t} [S(k) h(k) - r(k)]$$

where $\cdot$ denotes the complex conjugate, and $$e_{k+i} = s^t(k+i) h(k) - r_{k+i}$$

In this case, the transmission path response h(k) which minimizes the above evaluation function E(k) can be expressed by the following expression (8).

$$h(k) = [S^t(k) S(k)]^{-1} S^t(k) r(k) \quad (8)$$

In the following, the estimation for the transmission path response h(k) derived by the expression (8) is called an estimated transmission path response.

In this manner, when the transmission signal sequence and the received signal sequence up to a certain time are given, the estimated transmission path response can be derived.

Now, a case of applying the Viterbi algorithm to a transmission code trellis with a number of states P and a number of branches per state Q as shown in FIG. 2 is considered, and the m-th state ($1 \leq m \leq P$) at a time kT is denoted as m(k), while each state at each time is assumed to be equipped with a survivor path corresponding to a path metric $p_{k,m}$ and the estimated transmission path response $h_m(k)$.

Then, by considering a branch for making a transition from the state m'(k−1) to the state m(k) between the time (k−1)T and the time kT (which will be denoted as m(k)/m'(k−1) or m/m' hereinbelow), the estimated transmission path response $h_{m'}(k-1)$ at the state m'(k−1) can be expressed by the following expression (9).

$$h_{m'}(k-1) = [S_{m'}{}^t(k-1) S_{m'}(k-1)]^{-1} S_{m'}{}^t(k-1) r(k-1) \quad (9)$$

where r(k−1) can be read out from the received signal memory 12.

In this expression (9), a matrix $G_{m'}(k-1) = [S_{m'}{}^t(k-1) S_{m'}(k-1)]^{-1} S_{m'}{}^t(k-1)$ can be calculated as long as the code sequence $\{S_{k-N-L+1}, \ldots, S_{k-2}, S_{k-1}\}$ of the past (N+L−1) transmission symbols can be given in advance. Thus, by pre-calculating this matrix for all the possible code sequences of the length (N+L−1) and storing the pre-calculated matrices in the matrix memory 11 in advance, and then reading each one of them as the need arises, it is possible to reduce the amount of real time calculations.

Here, however, in this expression (9), a matrix $[S_{m'}{}^t(k-1) S_{m'}(k-1)]$ is not necessarily a normal one, and when this matrix is not normal, the calculation of the inverse of this matrix appearing in the above equation (9) is impossible. In such a case, conventionally, the estimated transmission path response in the state m'(k−1) has been approximated by the previous estimated transmission path response used at a previous time by the survivor path for that state m'(k−1) (i.e., the estimated transmission path response used in the state m''(k−2) in this case).

Namely, the estimated received signal $r'_{k,m/m'}$ (where suffix m/m' indicates that the quantity is related to the branch for making a transition from the state m' to the state m) at the state m(k) is obtained by the following equation (10), assuming the previous estimated transmission path response $h_{m'}(k-1)$ is still valid.

$$r'_{k,m/m'} = h_{m'}(k-1) s_{m/m'}(k) \quad (10)$$

Then, the branch metric $b_{k,m/m'}$ for this branch m/m' can be calculated as a square of an absolute value of a difference between the estimated received signal $r'_{k,m/m'}$ and the actual received signal $r_k$, by the following equation (11).

$$b_{k,m/m'} = |r_k - r'_{k,m/m'}|^2 \quad (11)$$
$$= |r_k - s_{m/m'}{}^t(k) h_{m'}(k-1)|^2$$

Also, the path metric $p_{k,m}$ for this branch m/m' defined as a cumulative value of the branch metrics can be calculated by the following equation (12), using each branch metric calculated according to the equation (11) and the path metric for the previous state m'(k−1).

$$p_{k,m} = p_{k-1,m'} + b_{k,m/m'} \quad (12)$$

Then, one branch among the Q different branches reaching to the state m(k) which minimizes the path metric calculated according to the equation (12) is selected by the processing control unit 16, such that the new survivor path for the state m(k) can be obtained by adding the selected branch at the end of the previous survivor path for the previous state m'(k−1).

The obtained survivor path and the path metric for this survivor path are then stored together in the path memory 13.

This procedure is also carried out for each state m(k), so as to update all the survivor paths and the path metrics for all the states at the time kT, and then k is increased by one to proceed to the next time.

Thus, the procedure of this conventional method of maximum likelihood sequence estimation described above can be represented by a diagram shown in FIG. 3.

More specifically, for a given set of the received signals $\{r_k\}$, a received signal vector r(k−1) is read out from the received signal memory 12 at the step S11, while each transmission sequence candidate is specified according to the updated survivor path read out from the path memory 13 at the step S12 and the matrix $G_{m'}(k-1)$ for the specified transmission sequence candidate is read out from the matrix memory 11 at the step S13. Then, a matrix calculation to obtain the estimated transmission path response $h_{m'}(k-1)$ from the received signal vector r(k−1) read out at the step S11 and the matrix $G_{m'}(k-1)$ read out at the step S13 is carried out at the step S14, and an inner product calculation to obtain the estimated received signal $r'_{k,m/m'}$ from the estimated transmission path response $h_{m'}(k-1)$ calculated at the step S14 and the transmission signal $s_{m/m'}(k)$ for the branch m/m' in the transmission sequence candidate specified at the step S12 is carried out at the step S15. Then, a difference between each received signal $r_k$ and the estimated received signal $r'_{k,m/m'}$ is calculated at the step S16, and the branch metric is calculated at the step S17 from the difference calculated at the step S16. Finally, the survivor path is selected at the step S18 according to the branch metric calculated at the step S17, such that the survivor path and the path metric in the path memory 13 can be updated at the step S12.

When this procedure is continued for each time k and the survivor paths are traced backwards in time (toward the left in the trellis of FIG. 2), the number of the survivor paths gradually decreases and the survivor paths eventually merge into only one survivor path at some point in the past, so that the estimation of the transmission sequence can be regarded as completed up to that point at which the survivor paths merge. Thus, by repeating the updating of the survivor paths and the transmission path response estimation alternately, the transmission signal sequence can be estimated sequentially, with some time lag.

In this method, the superior high speed follow up characteristic is realizable because the transmission path response estimation is made on a basis of a finite number (equal to NT) of the received signals. Here, the follow up characteristic can be improved by making N smaller. However, in order to reduce the influence of the noises, a larger N is preferable. Consequently, in practice, the size of N is determined according to the relative importance of the follow up characteristic and the noise influence reduction.

Now, this conventional method for the adaptive maximum likelihood sequence estimation scheme has been associated with the problem concerning the huge amount of real time calculations required.

Namely, the amount of real time calculations required per each sampling time can be expressed as (amount of calculations per branch)×(number of branches per state)×(number of states). Here, the last two factors are unaffected by the branch metric calculation procedure adopted, once the trellis is specified, so that the total amount of real time calculations required basically depends on how large the amount of calculations per branch is.

In this regard, the majority of the amount of calculations per branch is occupied by the calculations of the estimated transmission path response $h_{m'}(k-1)$ and the calculations for deriving the estimated received signal $r'_{k,m/m'}$ from the estimated transmission path response.

More specifically, the calculations of the estimated transmission path response require LN steps of multiplication and L(N−1) steps of addition, while the calculations of the estimated received signal require L steps of multiplication and (L−1) steps of addition. Besides these, the calculation of the path metric also requires one step of subtraction and one step of square calculation, so that the total number of these real time calculations required in the conventional method is (2LN+L+1), irrespective of the difference in types of calculations.

This number of real time calculations required can be particularly large for a case L must be set to be large, such as a case in which the multi-path delay extends over several symbols, and could present a serious problem in practice.

SUMMARY OF THE INVENTION

It is therefore an object of the present invention to provide a method and an apparatus for estimating a maximum likelihood sequence capable of reducing an amount of real time calculations involved, while maintaining a high speed follow up characteristic.

It is another object of the present invention to provide a method and an apparatus for estimating a maximum likelihood sequence capable of improving the high speed follow up characteristic.

According to one aspect of the present invention there is provided a method for estimating a maximum likelihood sequence in a digital communication receiver, comprising the steps of: sampling received signals at a predetermined sampling frequency; sequentially storing at least N of the received signals sampled for at least N previous sampling times by the sampling step, where N is an integer, for forming N-dimensional received signal vector for a present sampling time, in a first memory means; storing N-dimensional vectors corresponding to all possible transmission sequence candidates of a prescribed length, which are pre-calculated according to a prescribed definition, in a second memory means; calculating an inner product of one of the N-dimensional vectors stored in the second memory means corresponding to each transmission sequence candidate resulting from each one of branches reaching to each state at the present sampling time with the N-dimensional received signal vector for the present sampling time stored in the first memory means to obtain an estimated received signal for said each one of the branches at the present sampling time; and estimating the maximum likelihood sequence as a survivor path for said each state at the present sampling time by selecting one of the branches reaching to said each state which minimizes a path metric defined as a cumulative value of a square of an absolute value of a difference between the estimated received signal for each sampling time up to the present sampling time calculated by the calculating step and an actual received signal for said each sampling time up to the present sampling time.

According to another aspect of the present invention there is provided an apparatus for estimating a maximum likelihood sequence in a digital communication receiver, comprising: sampling means for sampling received signals at a predetermined sampling frequency; first memory means for sequentially storing at least N of the received signals sampled for at least N previous sampling times by the sampling means, where N is an integer, for forming N-dimensional received signal vector for a present sampling time; second memory means for storing N-dimensional vectors corresponding to all possible transmission sequence candidates of a prescribed length, which are pre-calculated according to a prescribed definition; calculation means for calculating an inner product of one of the N-dimensional vectors stored in the second memory means corresponding to each transmission sequence candidate resulting from each one of branches reaching to each state at the present sampling time with the N-dimensional received signal vector for the present sampling time stored in the first memory means to obtain an estimated received signal for said each one of the branches at the present sampling time; and means for estimating the maximum likelihood sequence as a survivor path for said each state at the present sampling time by selecting one of the branches reaching to said each state which minimizes a path metric defined as a cumulative value of a square of an absolute value of a difference between the estimated received signal for each sampling time up to the present sampling time calculated by the calculating means and an actual received signal for said each sampling time up to the present sampling time.

Other features and advantages of the present invention will become apparent from the following description taken in conjunction with the accompanying drawings.

DETAILED DESCRIPTION OF THE PREFERRED EMBODIMENTS

Figure 1:
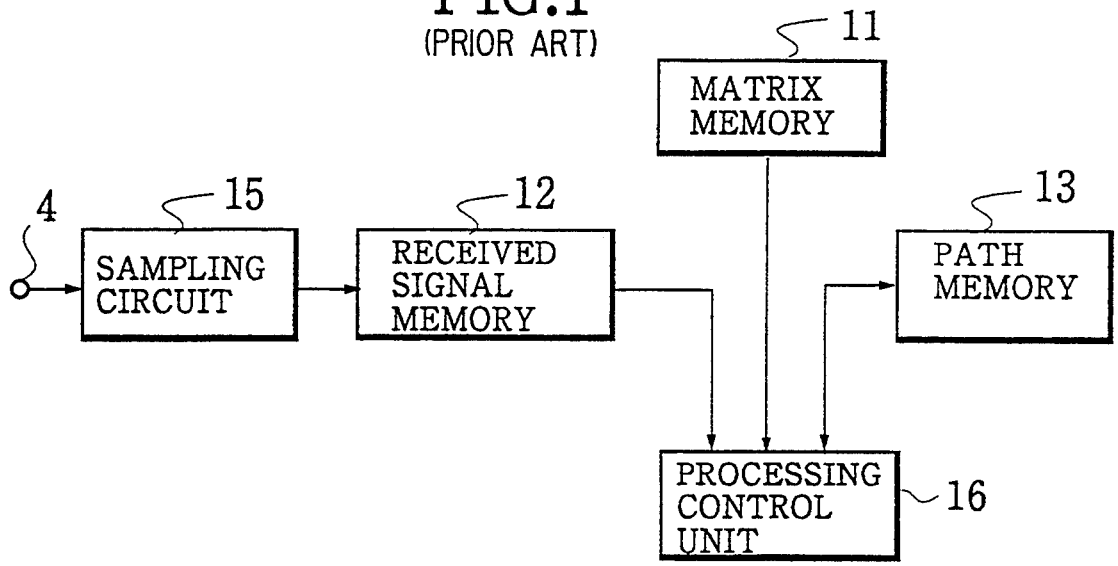
FIG. 1 is a schematic block diagram of a conventional apparatus for estimating maximum likelihood sequence in a digital communication receiver.
Figure 2:
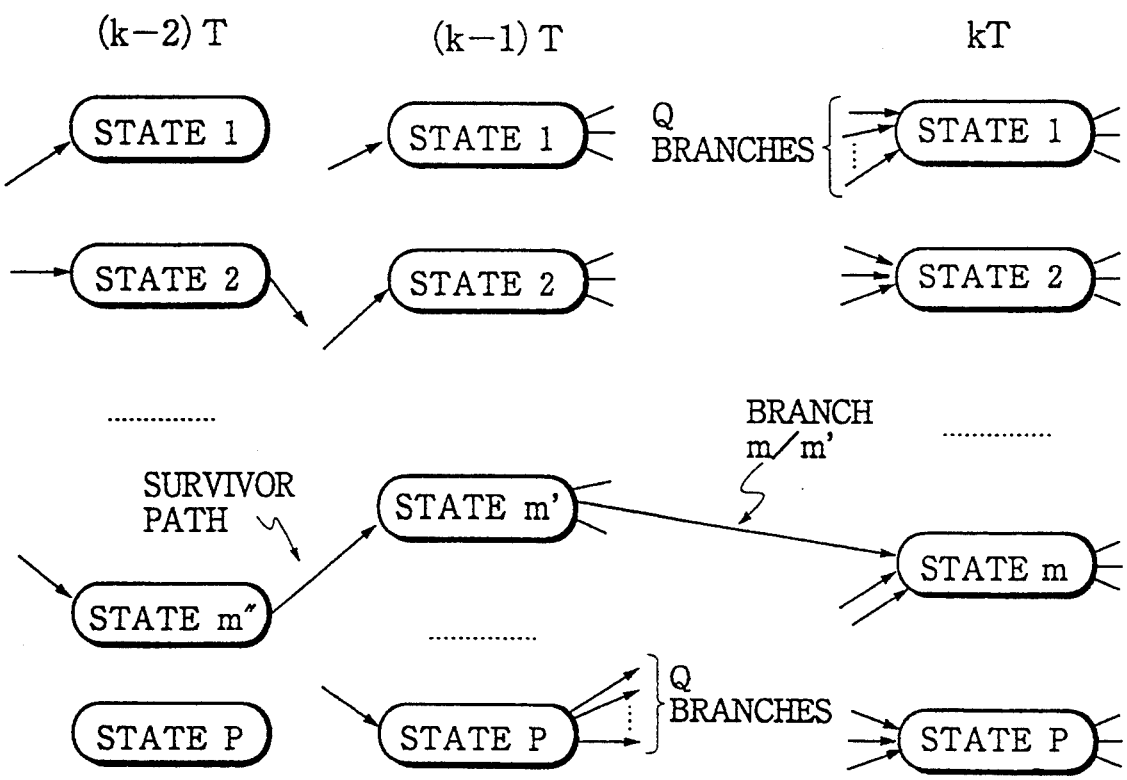
FIG. 2 is a diagram representing an exemplary trellis diagram according to which the maximum likelihood sequence is to be estimated.
Figure 3:
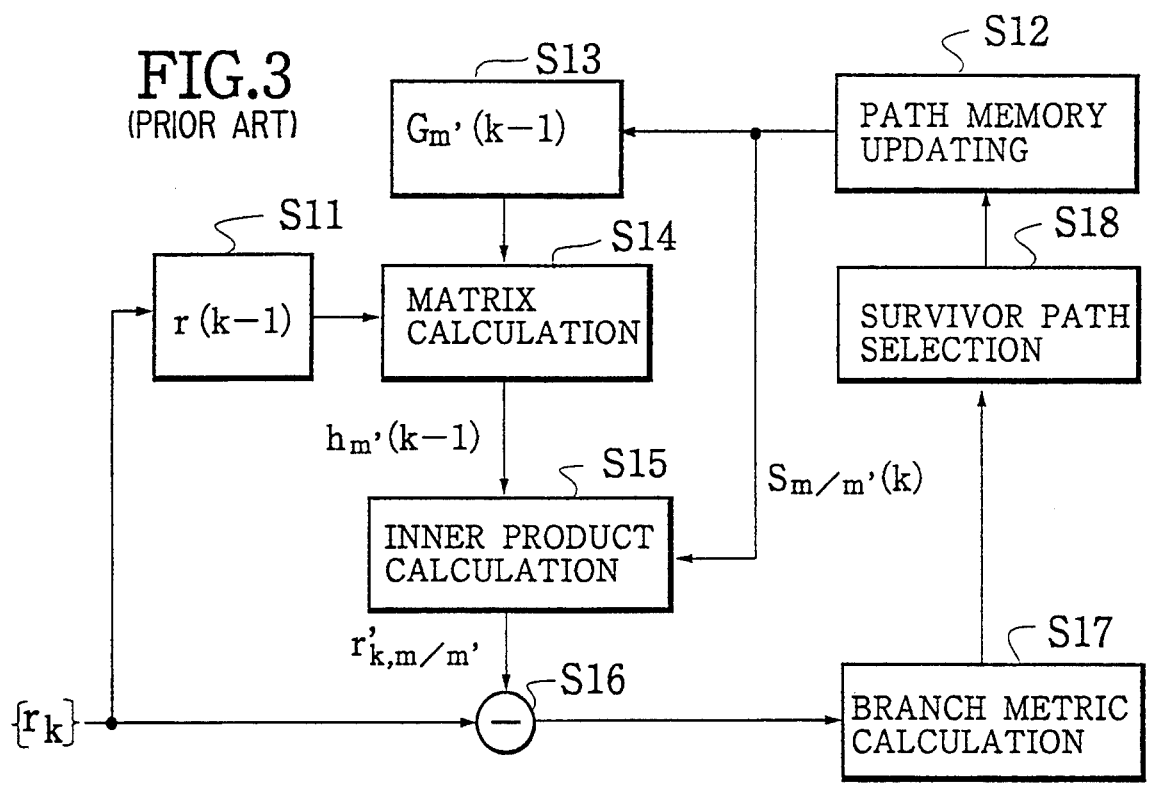
FIG. 3 is a diagram representing a procedure of a conventional method of maximum likelihood sequence estimation to be carried out by the apparatus of FIG. 1.

First, a general procedure of the method of maximum likelihood sequence estimation according to the present invention will be outlined.

In the present invention, the evaluation function $E'(k)$ defined by the following equation (13) is used in deriving the estimated transmission path response.

$$E'(k) = \sum_{i=-N+1}^{0} |e_{k+i}|^2 + \delta\, h^{\cdot t}(k)\, h(k) \quad (13)$$

$$= [S(k)\, h(k) - r(k)]^{\cdot t}\, [S(k)\, h(k) - r(k)] + \delta\, h^{\cdot t}(k)\, h(k)$$

where $$e_{k+i} = s^t(k+i)\, h(k) - r_{k+i}$$

and $\delta$ is a positive infinitesimal constant.

It can easily be seen that this evaluation function $E'(k)$ of the equation (13) is the evaluation function $E(k)$ of the equation (7) used in the conventional method added with a square of an element of the estimated transmission path response weighted by $\delta$. In other words, in the evaluation function $E'(k)$ of the equation (13), the target object to be minimized is still a square sum of errors for the received signals, but at the same time, this evaluation function $E'(k)$ requires each of the estimated transmission path response $h(k)$ to be as small as possible.

With the evaluation function $E'(k)$ so defined, the estimated transmission path response $h(k)$ for minimizing this evaluation function $E'(k)$ can be expressed by the following equation (14).

$$h(k) = [S^{\cdot t}(k)\, S(k) + \delta I]^{-1}\, S^{\cdot t}(k)\, r(k) \quad (14)$$

where I denotes an L-dimensional unit matrix.

Then, by setting $\delta$ in this equation (14) to an appropriate size, it becomes possible to make the matrix $[S^{\cdot t}(k)\, S(k) + \delta I]$ appearing in this equation (14) to be a normal one, without significantly affecting the estimated transmission path response. Consequently, the inverse of this matrix $[S^{\cdot t}(k)\, S(k) + \delta I]$ required in this equation (14) can always be calculated, and as a result, there will be no need for using the estimated transmission path response for the previous time as an approximation as in the conventional method described above, as long as the transmission path response is estimated according to this equation (14).

Therefore, the estimated transmission path response $h_{m'}(k-1)$ in the state $m'(k-1)$ can always be expressed by the following equation (15).

$$h_{m'}(k-1) \quad (15)$$
$$= [S_{m'}^{\cdot t}(k-1)\, S_{m'}(k-1) + \delta I]^{-1}\, S_{m'}^{\cdot t}(k-1)\, r(k-1)$$

Accordingly, the estimated received signal $r'_{k,m/m'}$ in the state $m(k)$ can always be expressed by the following equation (16).

$$\begin{aligned} r'_{k,m/m'} &= h_{m'}^{t}(k-1)\, s_m(k) \quad (16) \\ &= \{[S_{m'}^{\cdot t}(k-1)\, S_{m'}(k-1) + \delta I]^{-1} \\ &\quad S_{m'}^{\cdot t}(k-1)\, r(k-1)\}^{t}\, s_m(k) \\ &= r^{t}(k-1)\, S_{m'}(k-1) \\ &\quad [S_{m'}^{\cdot t}(k-1)\, S_{m'}(k-1) + \delta I]^{-1}\, s_m(k) \end{aligned}$$

Here, let an N-dimensional vector $g_{m/m'}(k)$ be defined by the following equation (17).

$$\begin{aligned} g_{m/m'}(k) & \quad (17) \\ = S_{m'}(k-1)\, [S_{m'}^{\cdot t}(k-1)\, S_{m'}(k-1) + \delta I]^{-1}\, s_m(k) \end{aligned}$$

Then, the equation (16) can be rewritten as the following equation (18).

$$r'_{k,m/m'} = r^{t}(k-1)\, g_{m/m'}(k) \quad (18)$$

Note here that this N-dimensional vector $g_{m/m'}(k)$ of the equation (17) can be uniquely determined when a branch $m(k)/m'(k-1)$ is specified, in correspondence to the last $(L+N)$ symbols of the survivor path for that branch.

Thus, by taking an inner product of this N-dimensional vector $g_{m/m'}(k)$ and the received signal vector $r(k-1)$ at a time $(k-1)T$, the estimated received signal $r'_{k,m/m'}$ at a time $kT$ can be obtained, as expressed by the equation (18).

Consequently, the N-dimensional vectors $g(\cdot)$, where $(\cdot)$ denotes a generalized notion of $m/m'(k)$, can be pre-calculated for all the possible transmission sequence candidates of the length $(L+N)$, so that it becomes possible to store a set $\{g(\cdot)\}$ of the N-dimensional vectors $g(\cdot)$ for all the possible transmission sequence candidates in a ROM (Read Only Memory) in advance and read out the necessary one of them from the ROM at a time of the branch metric calculation.

When the estimated received signal $r'_{k,m/m'}$ is determined according to the equation (18), the calculation of the branch metric as well as the updating of the survivor path and the path metric can be carried out in a manner similar to that in the conventional method described above.

Figure 4:
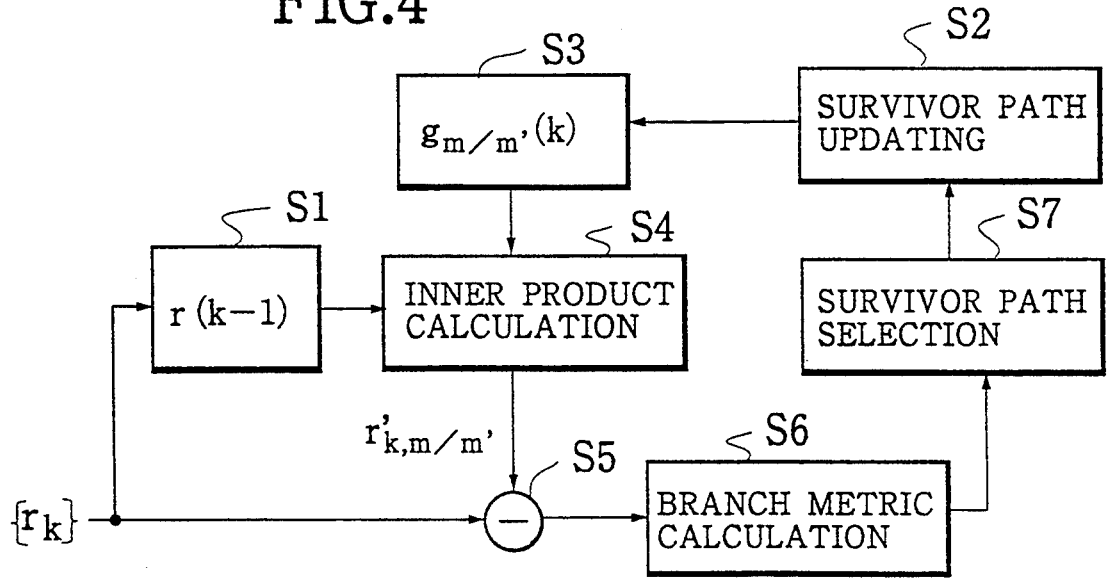
FIG. 4 is a diagram representing a general procedure of a method of maximum likelihood sequence estimation according to the present invention.

Thus, the procedure for the method of maximum likelihood sequence estimation according to the present invention can be represented by a diagram shown in FIG. 4.

More specifically, for a given set of the received signals $\{r_k\}$, a received signal vector $r(k-1)$ is read out from a memory storing received signals at the step S1, while each transmission sequence candidate is specified according to the updated survivor path read out from a RAM (Random Access Memory) storing the updated survivor paths at the step S2 and the N-dimensional vector $g_{m/m'}(k)$ for the specified transmission sequence candidate is read out from a ROM (Read Only Memory) storing the N-dimensional vectors at the step S3. Then, an inner product calculation to obtain the estimated received signal $r'_{k,m/m'}$ from the the N-dimensional vector $g_{m/m'}(k)$ read out at the step S3 and the received signal vector $r(k-1)$ read out at the step S1 is carried out at the step S4. Then, a difference between each received signal $r_k$ and the estimated received signal $r'_{k,m/m'}$ is calculated at the step S5, and the branch metric is calculated at the step S6 from the difference calculated at the step S5. Finally, the survivor path is selected at the step S7 according to the branch metric calculated at the step S6, such that the survivor path and the path metric in the RAM can be updated at the step S2.

Here, as indicated by the diagram of FIG. 4, in order to calculate the estimated received signal $r'_{k,m/m'}$, it is no longer necessary to derive the estimated transmission path response $h_{m'}(k-1)$ by a real time calculation, as it can be calculated in advance, so that it becomes possible to reduce the amount of real time calculations required.

Namely, according to the present invention, the real time calculations required in obtaining the estimated received signal $r'_{k,m/m'}$ includes only N steps of the multiplication and (N−1) steps of the addition, which is approximately 1/L of (2LN+L+1) steps of real time calculations required in the conventional method, so that the significant reduction of the required amount of real time calculations becomes possible in the present invention, especially for a case with a large L setting such as a case in which the multi-path delay extends over several symbols.

Now, the first specific embodiment of the method of maximum likelihood sequence estimation according to the present invention will be described in detail.

Figure 5:
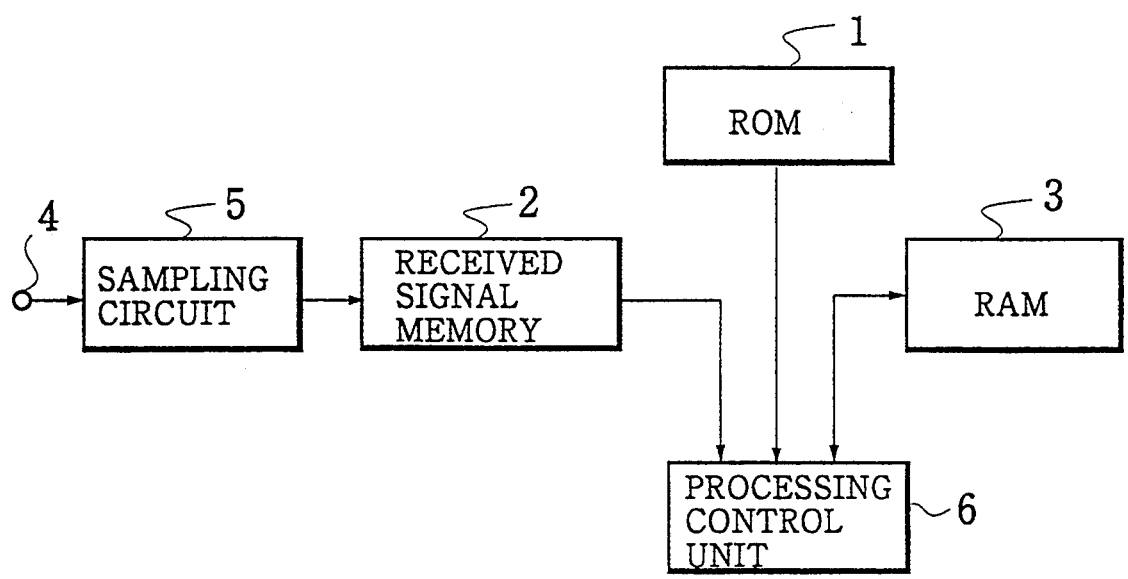
FIG. 5 is a schematic block diagram of one embodiment of an apparatus for estimating maximum likelihood sequence in a digital communication receiver according to the present invention.

FIG. 5 shows one embodiment of an apparatus for estimating the maximum likelihood sequence to be used in this embodiment, which comprises: an input terminal 4 for entering a received baseband signal r(t); a sampling circuit 5 connected to the input terminal 4; a received signal memory 2 made of either a RAM (Random Access Memory) or a shift register memory, which is connected to the sampling circuit 5; a processing control unit 6 connected to the received signal memory 2; a ROM (Read Only Memory) 1 connected to the processing control unit 6; and a RAM 3 connected to the processing control unit 6.

In this apparatus of FIG. 5, the received baseband signal r(t) entering at the input terminal 4 is sampled by a sampling circuit 5 at the sampling interval equal to a transmission symbol period T.

The received signal memory 2 sequentially stores at least (N+1) samples of the received signals sampled by the sampling circuit 5 from a time (k−N)T to a time kT.

The ROM 1 stores in advance the set $\{g(\cdot)\}$ of the N-dimensional vectors $g(\cdot)$ for all the possible transmission sequence candidates of the length (L+N) which are pre-calculated according to the equation (17) described above.

The RAM 3 stores the survivor path and the path metric for each state.

The processing control unit 6 carries out the calculations described below, according to the received signals stored in the received signal memory 2, the N-dimensional vectors $g(\cdot)$ stored in the ROM 1, and the survivor path and the path metric for each state stored in the RAM 3.

In this first embodiment, the operation proceeds as follows.

First, for each branch m(k)/m'(k−1) (also denoted as m/m') reaching to each state m(k) at a time kT, the processing control unit 6 obtains the survivor path for the state m'(k−1) from the RAM 3, and obtains a transmission sequence candidate as the last (L+N) symbols of a sequence obtained by adding this branch m/m' at an end of the survivor path, and then reads out the N-dimensional vector $g_{m/m'}(k)$ corresponding to this transmission sequence candidate from the ROM 1.

On the other hand, the processing control unit 6 reads out r(k−1) and rk from the received signal memory 2, while reading out the path metric $p_{k-1,m'}$ for the survivor path for the state m'(k−1), and then calculates the following equations (19) to (21).

$$r'_{m/m'} = r'(k-1) \, g_{m/m'}(k) \tag{19}$$

$$b_{k,m/m'} = |r_k - r'_{k,m/m'}|^2 \tag{20}$$

$$p_{k,m/m'} = p_{k-1,m'} + b_{k,m/m'} \tag{21}$$

These calculations are repeated for all the branches reaching to the state m(k) to obtain their respective path metrics $p_{k,m/m'}$, and a branch m/m' that gives the minimum path metric $p_{k,m}$ is selected among these branches.

Then, the survivor path for the state m(k) is obtained as the selected branch m/m' added at an end of the survivor path for the state m'(k−1) from which the selected branch m/m' stems, and this survivor path and the minimum path metric $p_{k,m}$ given by the selected branch are stored together in the RAM 3, so as to update the survivor path and the path metric stored in the RAM 3.

After these processes are repeated for all the states at the time kT, k is increased by one and the process is continued for the next time in the similar manner.

In this procedure of the first embodiment, the amount of real time calculations required is reduced to approximately 1/L of that required in the conventional method as already mentioned above, so that the processing time can be shortened considerably.

In addition, as also already mentioned above, there is no need to approximate the estimated transmission path response $h_{m'}(k-1)$, so that the estimated received signal $r'_{k,m/m'}$ is always obtainable more accurately.

Now, the second specific embodiment of the method of maximum likelihood sequence estimation according to the present invention will be described in detail.

In this second embodiment, the sampling frequency of the sampling circuit 5 in the apparatus of FIG. 5 is set to be twice of that used in the first embodiment described above. Here, the time is given in units of T'=T/2 and expressed as t=kT', where k is an ordered number. In addition, the even ones of k are denoted collectively as k'.

Now, in a case in which the transmission sequence $\{s_0, \ldots, s_{k'-2}, s_{k'}\}$ with a time interval equal to 2T'(=T) is transmitted from a transmitter side through a transmission modulator and an ideal radio transmission path without any distortion and noise, and received and demodulated at a receiver side, the sequence $\{x_0, \ldots, x_{k'-1}, x_{k'}, x_{k'+1}\}$ obtained by sampling the baseband waveform x(t) of the received signals at the sampling interval T' will be called an ideal received signal sequence corresponding to the transmission sequence $\{s_0, \ldots, s_{k'-2}, s_{k'}\}$.

Also, from the sequence $\{r_0, \ldots, r_{k-2}, r_{k-1}, r_k\}$ obtained by sampling the actual received signals at the sampling interval T', the N-dimensional received signal vector r(k) is defined by the following equation (22).

$$r(k) = [r_k, r_{k-1}, r_{k-2}, \ldots, r_{k-N+1}]^t \tag{22}$$

In addition, it is assumed that the transmission path response in this case can be simulated by the transversal filter with the tap interval T' and the tap number L.

Now, for a branch m(k')/m'(k'−2), when the survivor path $\{s_0, \ldots, s_{k'-2}, s_{k'}\}_{m/m'}$ is corresponding to the ideal received signal sequence $\{x_0, \ldots, x_{k'-1}, x_{k'}, x_{k'+1}\}_{m/m'}$, the ideal received signal vectors and the ideal received signal matrices for various times are defined by the following equations (23) to (25).

$$x_{m/m'}(k'+1) = [x_{k'+1}, x_{k'}, \ldots, x_{k'-L+2}]_{m/m'}{}^t$$

$$x_{m/m'}(k') = [x_{k'}, x_{k'-1}, \ldots, x_{k'-L+1}]_{m/m'}{}^t$$

$$\ldots$$

$$x_{m/m'}(k'-N) = [x_{k'-N}, x_{k'-N-1}, \ldots, x_{k'-N-L+1}]_{m/m'}{}^t \quad (23)$$

$$X_{m/m'}(k') = \begin{pmatrix} x_{m/m'{}^t}(k') \\ x_{m/m'{}^t}(k'-1) \\ \ldots \\ x_{m/m'{}^t}(k'-N+1) \end{pmatrix} \quad (24)$$

$$X_{m/m'}(k'-1) = \begin{pmatrix} x_{m/m'{}^t}(k'-1) \\ x_{m/m'{}^t}(k'-2) \\ \ldots \\ x_{m/m'{}^t}(k'-N) \end{pmatrix} \quad (25)$$

Then, using these equations (23) to (25), the following two N-dimensional vectors $g1_{m/m'}(k')$ and $g2_{m/m'}(k')$ are defined by the following equations (26) and (27).

$$g1_{m/m'}(k') \quad (26)$$
$$= X_{m/m'}(k'-1)[X_{m/m'}{}^t(k'-1)X_{m/m'}(k'-1) + \delta I]^{-1} x_{m/m'}(k')$$

$$g2_{m/m'}(k') \quad (27)$$
$$= X_{m/m'}(k')[X_{m/m'}{}^t(k')X_{m/m'}(k') + \delta I]^{-1} x_{m/m'}(k'+1)$$

Here, these two N-dimensional vectors $g1_{m/m'}(k')$ and $g2_{m/m'}(k')$ defined by the above equations (26) and (27) are uniquely determined from the last N' symbols (N'=[(N+L+1)/2] where [·] denotes that the fractional part is to be raised to a unit) of the branch m(k')/m'(k'−2).

Consequently, the N-dimensional vectors g1(·) and g2(·) can be pre-calculated for all the possible transmission sequence candidates of the length N', so that a set {(g1, g2)(·)} of these N-dimensional vectors g1(·) and g2(·) for all the possible transmission sequence candidates can be stored in advance in the ROM 1.

First, for each branch m/m' reaching to each state m(k') at a time k'T, the processing control unit 6 obtains the survivor path for the state m'(k'−2) from the RAM 3, and obtains a transmission sequence candidate as the last N' symbols of a sequence obtained by adding this branch m/m' at an end of the survivor path, and then reads out a set of two N-dimensional vectors $g1_{m/m'}(k')$ and $g2_{m/m'}(k')$ corresponding to this transmission sequence candidate from the ROM 1.

On the other hand, the processing control unit 6 reads out r(k'−1), r(k'), $r_{k'}$, and $r_{k'+1}$ from the received signal memory 2, while reading out the path metric $p_{k'-2,m'}$ for the survivor path for the state m'(k'−2), and then calculates the following equations (28) to (31).

$$r'_{k',m/m'} = r^t(k'-1) \, g1_{m/m'}(k') \quad (28)$$

$$r'_{k'+1,m/m'} = r^t(k') \, g2_{m/m'}(k') \quad (29)$$

$$b_{k',m/m'} = |r_{k'} - r'_{k',m/m'}|^2 + |r_{k'+1} - r'_{k'+1,m/m'}|^2 \quad (30)$$

$$p_{k',m/m'} = p_{k'-2,m'} + b_{k',m/m'} \quad (31)$$

These calculations are repeated for all the branches reaching to the state m(k') to obtain their respective path metrics $p_{k',m/m'}$, and a branch m/m' that gives the minimum path metric $p_{k',m}$ is selected among these branches.

Then, the survivor path for the state m(k') is obtained as the selected branch m/m' added at an end of the survivor path for the state m'(k'−2) from which the selected branch m/m' stems, and this survivor path and the minimum path metric $p_{k',m}$ given by the selected branch are stored together in the RAM 3, so as to update the survivor path and the path metric stored in the RAM 3.

After these processes are repeated for all the states at the time k'T, k is increased by one and the process is continued for the next time in the similar manner.

In this second embodiment, the bit error rate of the estimated sequence is hardly affected by the value of the phase of the sampling clock at the frequency 2/T. This is because the received baseband signals has its bandwidth limited within 1/T so that the sampling frequency of 2/T can satisfy the sampling theorem, such that any waveform can be expressed by the sampling sequence using this sampling frequency. This is in contrast to the first embodiment described above in which the phase of the sampling clock at the frequency 1/T has been assumed to be set to an optimum setting, so that the bit error rate of the estimated sequence in the first embodiment can be deteriorated quickly when the phase is displaced from the optimum setting.

Now, the third specific embodiment of the method of maximum likelihood sequence estimation according to the present invention will be described in detail.

In this third embodiment, the sampling frequency of the sampling circuit 5 in the apparatus of FIG. 5 is set to be F times of that used in the first embodiment described above. Here, the time is given in units of T''=T/F and expressed as t=kT'', where k is an ordered number. In addition, those k which are multiples of F are denoted collectively as k''.

Now, in a case in which the transmission sequence $\{s_0, \ldots, s_{k''-F}, s_{k''}\}$ with a time interval FT''(=T) is transmitted from a transmitter side through a transmission modulator and an ideal radio transmission path without any distortion and noise, and received and demodulated at a receiver side, the sequence $\{x_0, \ldots, x_{k''}, x_{k''+1}, \ldots, x_{k''+F+1}\}$ obtained by sampling the baseband waveform x(t) of the received signals at the sampling interval T'' will be called an ideal received signal sequence corresponding to the transmission sequence $\{s_0, \ldots, s_{k''-F}, s_{k''}\}$.

Also, from the sequence $\{r_0, \ldots, r_{k-2}, r_{k-1}, r_k\}$ obtained by sampling the actual received signals at the sampling interval T'', the N-dimensional received signal vector r(k) is defined by the following equation (22).

$$r(k) = [r_k, r_{k-1}, r_{k-2}, \ldots, r_{k-N+1}]^t \quad (32)$$

In addition, it is assumed that the transmission path response in this case can be simulated by the transversal filter with the tap interval T″ and the tap number L.

Now, for a branch m(k″)/m′(k″−F). when the survivor path $\{s_0, \ldots, s_{k''-F}, s_{k''}\}_{m/m'}$ is corresponding to the ideal received signal sequence $\{x_0, \ldots, x_{k''}, x_{k''+1}, \ldots x_{k''+F+1}\}_{m/m'}$, the ideal received signal vectors and the ideal received signal matrices for various times are defined by the following equations (33) to (34).

$$x_{m/m'}(k'' + F - 1) = [x_{k''+F-1}, x_{k''+F-2}, \ldots, x_{k''+F-L}]_{m/m'}{}^t \quad (33)$$

$$\ldots$$

$$x_{m/m'}(k'' - N) = [x_{k''-N}, x_{k''-N-1}, \ldots, x_{k''-N-L+1}]_{m/m'}{}^t$$

$$X_{m/m'}(k'' + F - 2) = \begin{pmatrix} x_{m/m'}{}^t(k'' + F - 2) \\ x_{m/m'}{}^t(k'' + F - 3) \\ \ldots \\ x_{m/m'}{}^t(k'' - N - 1) \end{pmatrix} \quad (34)$$

$$X_{m/m'}(k'' + F - 3) = \begin{pmatrix} x_{m/m'}{}^t(k'' + F - 3) \\ x_{m/m'}{}^t(k'' + F - 4) \\ \ldots \\ x_{m/m'}{}^t(k'' - F - N - 2) \end{pmatrix}$$

$$\ldots$$

$$X_{m/m'}(k'' - 1) = \begin{pmatrix} x_{m/m'}{}^t(k'' - 1) \\ x_{m/m'}{}^t(k'' - 2) \\ \ldots \\ x_{m/m'}{}^t(k'' - N) \end{pmatrix}$$

Then, using these equations (33) to (34), the following F of N-dimensional vectors $g1_{m/m'}(k'')$ to $gF_{m/m'}(k'')$ are defined by the following equations (35).

$$g1_{m/m'}(k'') \quad (35)$$
$$= X_{m/m'}{}^*(k'' - 1)[X_{m/m'}{}^{*t}(k'' - 1)X_{m/m'}(k'' - 1) + \delta I]^{-1}x_{m/m'}(k'')$$

$$g2_{m/m'}(k'')$$
$$= X_{m/m'}{}^*(k'')[X_{m/m'}{}^{*t}(k'')X_{m/m'}(k'') + \delta I]^{-1}x_{m/m'}(k'' + 1)$$

$$\ldots$$

$$gF_{m/m'}(k'')$$
$$= X_{m/m'}{}^*(k'' + F - 2)$$
$$[X_{m/m'}{}^{*t}(k'' + F - 2) X_{m/m'}(k'' + F - 2) + \delta I]^{-1} x_{m/m'}(k'' + F - 1)$$

Here, these N-dimensional vectors $g1_{m/m'}(k'')$ to $gF_{m/m'}(k'')$ defined by the above equations (35) are uniquely determined from the last N″ symbols (N″=[(N+L+F−1)/F] where [·] denotes that the fractional part is to be raised to a unit) of the branch m(k″)/m′(k″−F).

Consequently, the N-dimensional vectors $g1(\cdot)$ to $gF(\cdot)$ can be pre-calculated for all the possible transmission sequence candidates of the length N″, so that a set $\{(g1, g2, \ldots, gF)(\cdot)\}$ of these N-dimensional vectors $g1(\cdot)$ to $gF(\cdot)$ for all the possible transmission sequence candidates can be stored in advance in the ROM 1.

First, for each branch m/m′ reaching to each state m(k″) at a time k″T, the processing control unit 6 obtains the survivor path for the state m′(k″−F) from the RAM 3, and obtains a transmission sequence candidate as the last N″ symbols of a sequence obtained by adding this branch m/m′ at an end of the survivor path, and then reads out a set of two N-dimensional vectors $g1_{m/m'}(k'')$ to $gF_{m/m'}(k'')$ corresponding to this transmission sequence candidate from the ROM 1.

On the other hand, the processing control unit 6 reads out r(k″−1), r(k″), . . . , r(k″+F−2), $r_{k''}, r_{k''+1}, \ldots, r_{k''+F-1}$ from the received signal memory 2, while reading out the path metric $p_{k''-F,m'}$ for the survivor path for the state m′(k″−F), and then calculates the following equations (36) to (38).

$$r'_{k'',m/m'} = r^t(k'' - 1) g1_{m/m'}(k'') \quad (36)$$

$$r'_{k''+1,m/m'} = r^t(k'') g2_{m/m'}(k'')$$

$$\ldots$$

$$r'_{k''+F-1,m/m'} = r^t(k'' + F - 2) gF_{m/m'}(k'')$$

$$b_{k'',m/m'} = \sum_{j=1}^{F} |r_{k''-1+j} - r'_{k''-1+j,m/m'}|^2 \quad (37)$$

$$p_{k'',m/m'} = p_{k''-F,m'} + b_{k'',m/m'} \quad (38)$$

These calculations are repeated for all the branches reaching to the state m(k″) to obtain their respective path metrics $p_{k'',m/m'}$, and a branch m/m′ that gives the minimum path metric $p_{k'',m}$ is selected among these branches.

Then, the survivor path for the state m(k″) is obtained as the selected branch m/m′ added at an end of the survivor path for the state m′(k″−2) from which the selected branch m/m′ stems, and this survivor path and the minimum path metric $p_{k'',m}$ given by the selected branch are stored together in the RAM 3, so as to update the survivor path and the path metric stored in the RAM 3.

After these processes are repeated for all the states at the time k″T, k is increased by one and the process is continued for the next time in the similar manner.

In this third embodiment, just as in the second embodiment described above, the bit error rate of the estimated sequence is hardly affected by the value of the phase of the sampling clock at the frequency F/T. Here, this third embodiment is useful in a case in which a larger F is required, such as a case in which the received baseband signals are not exactly the baseband signals with the carrier frequency equal to zero in a strict sense, but they are the intermediate frequency signals with the carrier frequency equal to 2/T and the spectrum of ±1/T width on both sides of 2/T, in which case F can be set to 6, for example.

Now, the fourth specific embodiment of the method of maximum likelihood sequence estimation according to the present invention will be described in detail. This fourth embodiment is similar to the third embodiment described above, except that the definitions of the N-dimensional vectors to be pre-calculated and stored in advance in the ROM 1 are different. In the following, only those features of this fourth embodiment different from the third embodiment described above will be described.

Namely, in this fourth embodiment, for a branch $m(k'')/m'(k''-F)$, the following F of N-dimensional vectors $g1_{m/m'}(k'')$ to $gF_{m/m'}(k'')$ are defined by the following equations (39).

$$g1_{m/m'}(k'') \tag{39}$$
$$= W X_{m/m'}(k'' - 1)$$
$$[X_{m/m'}{}^t(k'' - 1) \, W X_{m/m'}(k'' - 1) + \delta I]^{-1} x_{m/m'}(k'')$$
$$g2_{m/m'}(k'')$$
$$= W X_{m/m'}(k'')$$
$$[X_{m/m'}{}^t(k'') \, W X_{m/m'}(k'') + \delta I]^{-1} x_{m/m'}(k'' + 1)$$
$$\ldots$$
$$gF_{m/m'}(k'')$$
$$= W X_{m/m'}(k'' + F - 2)$$
$$[X_{m/m'}{}^t(k'' + F - 2) \, W X_{m/m'}(k'' + F - 2) +$$
$$\delta I]^{-1} x_{m/m'}(k'' + F - 1)$$

where $$W = \begin{pmatrix} w_0 & & & 0 \\ & w_1 & & \\ & & \ddots & \\ 0 & & & w_{N-1} \end{pmatrix}$$

and $$w_j \geq 0, \; 0 \leq j \leq N-1$$

These equations (39) can be obtained by minimizing an evaluation function $E''(k)$ incorporating the time weight factor, expressed by the following equation (40).

$$E''(k) = \sum_{i=-N+1}^{0} w_{-i} |e_{k+i}|^2 + \delta \, h^t(k) \, h(k) \tag{40}$$

It is to be noted that this fourth embodiment can be reduced to the third embodiment described above by setting W to be an N-th order unit matrix I, while this fourth embodiment can be further reduced to the second embodiment described above by setting $F=2$ in addition.

This fourth embodiment is advantageous in that there is a possibility of improving the compatibility between the high speed follow up characteristic and the noise reduction characteristic, compared with a case of using $W = I$, depending on the choice of W.

For example, when the elements of W are set to be $W_{N-1} = 0$, $W_0 = 1$, and any $w_j$ between these two elements equal to a value on a straight line interpolating these two elements such that an area under a curve w as a function of j (which is called window) has a triangular shape, the more recent terms will be weighted lighter, so that the high speed follow up characteristic can be improved. In this case, the noise reduction characteristic will be deteriorated somewhat, but this deterioration can be compensated by setting N larger, such that there is a possibility for realizing the better high speed follow up characteristic with the same level of the noise reduction characteristic. In this manner, the shape of the area under the curve w as a function of j (window) can be set to a desired shape to optimize the desired characteristics, in contrast to the conventional method in which the shape of the area under the curve w as a function of j (window) has always been set to a rectangular shape.

Now, the fifth specific embodiment of the method of maximum likelihood sequence estimation according to the present invention will be described in detail. This fifth embodiment is a modification of the fourth embodiment described above in that F of the N-dimensional vectors $g1_{m/m'}(k'')$ to $gF_{m/m'}(k'')$ used in the fourth embodiment are replaced by F of the differently defined N-dimensional vectors as follows.

Namely, F of the N-dimensional vectors $g1_{m/m'}(k'')$ to $gF_{m/m'}(k'')$ used in the fourth embodiment are modified into F of the $(N-1)$-dimensional $g1'_{m/m'}(k'')$ to $gF'_{m/m'}(k'')$ by omitting the N-th components, while another F of slightly differently defined $(N-1)$-dimensional vectors $f1'_{m/m'}(k'')$ to $fF'_{m/m'}(k'')$ by defined by the following equations (41) to (43) are formed.

$$f1_{m/m'}(k'') \tag{41}$$
$$= W X_{m/m'}(k'' - 2)$$
$$[X_{m/m'}{}^t(k'' - 2) \, W X_{m/m'}(k'' - 2) + \delta I]^{-1} x_{m/m'}(k'')$$
$$f2_{m/m'}(k'') \tag{42}$$
$$= W X_{m/m'}(k'' - 1)$$
$$[X_{m/m'}{}^t(k'' - 1) \, W X_{m/m'}(k'' - 1) + \delta I]^{-1} x_{m/m'}(k'' + 1)$$
$$\ldots$$
$$fF_{m/m'}(k'') \tag{43}$$
$$= W X_{m/m'}(k'' + F - 3)$$
$$[X_{m/m'}{}^t(k'' + F - 3) \, W X_{m/m'}(k'' + F - 3) +$$
$$\delta I]^{-1} x_{m/m'}(k'' + F - 1)$$

Then, using these $g1'_{m/m'}(k'')$ to $gF'_{m/m'}(k'')$ and $f1'_{m/m'}(k'')$ to $fF'_{m/m'}(k'')$, the N-dimensional vectors $g1''_{m/m'}(k'')$ to $gF''_{m/m'}(k'')$ and $f1''_{m/m'}(k'')$ to $fF''_{m/m'}(k'')$ are defined by the following equations (44) and (45).

$$g1''_{m/m'}(k'') = [g1'_{m/m'}(k'') \; 0]^t \tag{44}$$
$$\ldots$$
$$gF''_{m/m'}(k'') = [gF'_{m/m'}(k'') \; 0]^t$$
$$f1''_{m/m'}(k'') = [0 \; f1'_{m/m'}(k'')]^t \tag{45}$$
$$\ldots$$
$$fF''_{m/m'}(k'') = [0 \; fF'_{m/m'}(k'')]^t$$

Then, F of the N-dimensional vectors $d1_{m/m'}(k'')$ to $dF_{m/m'}(k'')$ are defined as linear compositions of these $f1''_{m/m'}(k'')$ to $fF''_{m/m'}(k'')$ and $g1''_{m/m'}(k'')$ to $gF''_{m/m'}(k'')$ by the following equations (46).

$$d1_{m/m'}(k'') = (1 + \alpha) g1''_{m/m'}(k'') - \alpha f1''_{m/m'}(k'') \tag{46}$$
$$\ldots$$

-continued $$dF_{m/m'}(k'') = (1 + \alpha) gF'_{m/m'}(k'') - \alpha fF'_{m/m'}(k'')$$

where $\alpha$ is a positive constant.

Now, in this fifth embodiment, these N-dimensional vectors $d1_{m/m'}(k'')$ to $dF_{m/m'}(k'')$ are pre-calculated and stored in advance in the ROM 1 instead of the N-dimensional vectors $g1_{m/m'}(k'')$ to $gF_{m/m'}(k'')$ used in the fourth embodiment, and the processing control unit 6 calculates the following equations (47).

$$r'_{k',m/m'} = r^t(k'-1) d1_{m/m'}(k') \qquad (47)$$

$$r'_{k'+1,m/m'} = r^t(k') d2_{m/m'}(k')$$

...

$$r'_{k'+F-1,m/m'} = r^t(k'+F-2) dF_{m/m'}(k')$$

Then, the calculations of the branch metric $b_{k',m/m'}$ and the path metric $p_{k',m/m'}$ as well as the determination of the survivor path and the updating of the stored content of the RAM 3 are carried out in a manner similar to that described above for the third embodiment.

This fifth embodiment is advantageous in that it is possible to improve the high speed follow up characteristic when the transmission path characteristic rapidly changes in time, compared with the first to fourth embodiments described above.

Namely, conventionally, the transmission path response used in deriving the estimated received signal $r'_k$ has been $h(k-1)$. However, this transmission path response $h(k-1)$ is originally determined so as to minimize the square sum of the output errors for the past N samples of the received signals, so that it is more accurate to consider this quantity as the transmission path response at a time somewhat earlier than a time kT, rather than the transmission path response at a time kT.

For this reason, it is more accurate to determine the estimated received signal $r'_k$ from $h(k)$ given by the following equation (48) which is effectively an extrapolation to a future direction according to the transmission path responses $h(k-1)$ and $h(k-2)$.

$$\begin{aligned} h(k) &= h(k-1) + \alpha \{h(k-1) - h(k-2)\} \\ &= \{1 + \alpha\} h(k-1) - \alpha h(k-2) \end{aligned} \qquad (48)$$

Now, in the present invention, the transmission path response does not explicitly appear in the procedure to determine $r'_k$, as the vectors g such as those given by the above equations (44) are used. Here, just as the vectors g are relevant to the transmission path response $h(k-1)$, the vectors f such as those given by the above equations (45) are relevant to the transmission path response $h(k-2)$. Consequently, when the vectors relevant to the transmission path response $h((k)$ are calculated, the vectors d such as those given by the above equation (46) can be obtained.

Here, it is to be noted that the setting of the value of $\alpha$ is a matter of design choice. For example, when W=1 is used, it is appropriate to use $\alpha = N/2$.

Thus, when the survivor path is correctly estimated, the estimated received signal $r'_k$ obtained in this manner is capable of follow up the high speed transmission path response change without a significant delay.

It is also to be noted here that the definition of the N-dimensional vectors to be pre-calculated and stored in advance in the ROM 1 are not necessarily limited to those described above for the first to fifth embodiments, and any N-dimensional vector quantities whose inner product with the N-dimensional vectors formed by the previously received signals give the estimated received signal for the present time should be considered within the scope of the present invention.

It is further to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method for estimating a maximum likelihood sequence in a digital communication receiver, comprising the steps of:

sampling received signals at a predetermined sampling frequency;

sequentially storing at least N of the received signals sampled for at least N previous sampling times by the sampling step, where N is an integer, for forming an N-dimensional received signal vector for a present sampling time, in a first memory means;

storing N-dimensional vectors corresponding to all possible transmission sequence candidates of a prescribed length L, which are pre-calculated according to a prescribed definition for defining the N-dimensional vectors, in a second memory means;

calculating an inner product of one of the N-dimensional vectors stored in the second memory means corresponding to each transmission sequence candidate resulting from each one of branches reaching to each state at the present sampling time with the N-dimensional received signal vector for the present sampling time stored in the first memory means to obtain an estimated received signal for said each one of the branches at the present sampling time; and estimating the maximum likelihood sequence as a survivor path for said each state at the present sampling time by selecting one of the branches reaching to said each state which minimizes a path metric defined as a cumulative value of a square of an absolute value of a difference between the estimated received signal for each sampling time up to the present sampling time calculated by the calculating step and an actual received signal for said each sampling time up to the present sampling time.

2. The method of claim 1, wherein at the storing step, the prescribed definition of the N-dimensional vectors is expressed by:

$$g_{m/m'}(k) = s_{m'}(k-1) [s_{m'}{}^t(k-1) s_{m'}(k-1) + \delta I]^{-1} s_m(k)$$

where $g_{m/m'}(k)$ is an N-dimensional vector for a transmission sequence candidate resulting from a branch from a state m' to a state m at a k-th sampling time, $S_{m'}(k-1)$ is an N×L transmission signal matrix for the state m' at a (k−1)-th sampling time, $\delta$ is a positive infinitesimal constant, I is an L-dimensional unit matrix, and $s_m(k)$ is an L-dimensional transmission signal vector for the state m at the k-th sampling time.

3. The method of claim 1, wherein at the storing step, the N-dimensional vectors are pre-calculated for a transmission path response for minimizing an evaluation function expressed by:

$$E'(k) = \sum_{i=-N+1}^{0} |e_{k+i}|^2 + \delta \, h^t(k) \, h(k)$$

$$= [S(k) h(k) - r(k)]^t [S(k) h(k) - r(k)] + \delta \, h^t(k) \, h(k)$$

where $E'(k)$ is the evaluation function at a k-th sampling time, $e_{k+i}$ is given by:

$$e_{k+i} = s^t(k+i) \, h(k) - r_{k+i}$$

$s(k+i)$ is an L-dimensional transmission signal vector at a $(k+i)$-th sampling time, $h(k)$ is the transmission path response at the k-th sampling time, $r_{k+i}$ is a $(1-i)$-th element of the N-dimensional received signal vector at the k-th sampling time, $\delta$ is a positive infinitesimal constant, $S(k)$ is an $N \times L$ transmission signal matrix at the k-th sampling time, and $r(k)$ is the N-dimensional received signal vector at the k-th sampling time.

4. The method of claim 1, wherein at the sampling step, the sampling frequency is F times a transmission symbol frequency, where F is an integer greater than one.

5. The method of claim 4, wherein at the storing step, the prescribed definition of the N-dimensional vectors is expressed by:

$$g1_{m/m'}(k'') = X_{m/m'}(k''-1)$$

$$[X_{m/m'}{}^t(k''-1) X_{m/m'}(k''-1) + \delta I]^{-1} x_{m/m'}(k'')$$

$$g2_{m/m'}(k'') = X_{m/m'}(k'')$$

$$[X_{m/m'}{}^t(k'') X_{m/m'}(k'') + \delta I]^{-1} x_{m/m'}(k''+1)$$

$$\vdots$$

$$gF_{m/m'}(k'') = X_{m/m'}(k''+F-2)$$

$$[X_{m/m'}{}^t(k''+F-2) X_{m/m'}(k''+F-2) + \delta I]^{-1} x_{m/m'}(k''+F-1)$$

where $g1_{m/m'}(k'')$ to $gF_{m/m'}(k'')$ are the N-dimensional vectors for a transmission sequence candidate resulting from a branch from a state $m'$ to a state m at a $k''$-th sampling time, $X_{m/m'}(k'')$ is an ideal received signal matrix for the transmission sequence candidate resulting from the branch from the state $m'$ to the state m at the $k''$-th sampling time, $\delta$ is a positive infinitesimal constant, I is an L-dimensional unit matrix, and $x_{m/m'}(k'')$ is an ideal received signal vector for the transmission sequence candidate resulting from the branch from the state $m'$ to the state m at the $k''$-th sampling time.

6. The method of claim 1, wherein at the storing step, each of the N-dimensional vectors includes a time weight factor.

7. The method of claim 6, wherein at the storing step, the prescribed definition of the N-dimensional vectors is expressed by:

$$g1_{m/m'}(k'') = W X_{m/m'}(k''-1)$$

$$[X_{m/m'}{}^t(k''-1) W X_{m/m'}(k''-1) + \delta I]^{-1} x_{m/m'}(k'')$$

$$g2_{m/m'}(k'') = W X_{m/m'}(k'')$$

-continued $$[X_{m/m'}{}^t(k'') X_{m/m'}(k'') + \delta I]^{-1} x_{m/m'}(k''+1)$$

$$\vdots$$

$$gF_{m/m'}(k'') = W X_{m/m'}(k''+F-2)$$

$$[X_{m/m'}{}^t(k''+F-2) W X_{m/m'}(k''+F-2) + \delta I]^{-1} x_{m/m'}(k''+F-1)$$

where $g1_{m/m'}(k'')$ to $gF_{m/m'}(k'')$ are the N-dimensional vectors for a transmission sequence candidate resulting from a branch from a state $m'$ to a state m at a $k''$-th sampling time, F is an integer greater than one, W is the time weight factor given by:

$$W = \begin{bmatrix} w_0 & & & 0 \\ & w_1 & & \\ & & \ddots & \\ 0 & & & w_{N-1} \end{bmatrix}$$

$w_j \geq 0$, $0 \leq j \leq N-1$, $X_{m/m'}(k'')$ is an ideal received signal matrix for the transmission sequence candidate resulting from the branch from the state $m'$ to the state m at the $k''$-th sampling time, $\delta$ is a positive infinitesimal constant, I is an L-dimensional unit matrix, and $x_{m/m'}(k'')$ is an ideal received signal vector for the transmission sequence candidate resulting from the branch from the state $m'$ to the state m at the $k''$-th sampling time.

8. The method of claim 1, wherein at the storing step, the N-dimensional vectors are pre-calculated for a transmission path response for minimizing an evaluation function expressed by:

$$E''(k) = \sum_{i=-N+1}^{0} w_{-i} |e_{k+i}|^2 + \delta \, h^t(k) \, h(k)$$

where $E''(k)$ is the evaluation function at a k-th sampling time, $w_{-i}$ is a $(-i)$-th time weight factor, $e_{k+i}$ is given by:

$$e_{k+i} = s^t(k+i) \, h(k) - r_{k+i}$$

$s(k+i)$ is an L-dimensional transmission signal vector at a $(k+i)$-th sampling time, $h(k)$ is the transmission path response at the k-th sampling time, $r_{k+i}$ is a $(1-i)$-th element of the N-dimensional received signal vector, and $\delta$ is a positive infinitesimal constant.

9. The method of claim 1, wherein at the storing step, the N-dimensional vectors are pre-calculated for a transmission path response expressed by:

$$h(k) = h(k-1) + \alpha \{h(k-1) - h(k-2)\}$$
$$= \{1 + \alpha\} h(k-1) - \alpha \, h(k-2)$$

where $h(k)$ is the transmission path response at a k-th sampling time, and $\alpha$ is a positive constant.

10. The method of claim 1, wherein at the storing step, the prescribed definition of the N-dimensional vectors is expressed by:

$$d1_{m/m'}(k'') = (1 + \alpha) g1''_{m/m'}(k'') - \alpha f1''_{m/m'}(k'')$$

$$\vdots$$

$$dF_{m/m'}(k'') = (1 + \alpha) gF''_{m/m'}(k'') - \alpha fF''_{m/m'}(k'')$$

where $d1_{m/m'}(k'')$ to $dF_{m/m'}(k'')$ are the N-dimensional vectors for a transmission sequence candidate resulting from a branch from a state m' to a state m at a k''-th sampling time, $\alpha$ is a positive constant, and $g1''_{m/m'}(k'')$ to $gF''_{m/m'}(k'')$ and $f1''_{m/m'}(k'')$ to $fF''_{m/m'}(k'')$ are given by:

$$g1''_{m/m'}(k'') = [g1'_{m/m'}(k'')\ 0]^t$$

$$\vdots$$

$$gF''_{m/m'}(k'') = [gF'_{m/m'}(k'')\ 0]^t$$

$$g1_{m/m'}(k'') = W X_{m/m'}(k'' - 1)$$

$$[X_{m/m'}{}^t (k'' - 1)\ W X_{m/m'}(k'' - 1) + \delta I]^{-1} x_{m/m'}(k'')$$

$$g2_{m/m'}(k'') = W X_{m/m'}(k'')$$

$$[X_{m/m'}{}^t (k'')\ X_{m/m'}(k'') + \delta I]^{-1} x_{m/m'}(k'' + 1)$$

$$\vdots$$

$$gF_{m/m'}(k'') = W X_{m/m'}(k'' + F - 2)$$

$$[X_{m/m'}{}^t (k'' + F - 2)\ W X_{m/m'}(k'' + F - 2) + \delta I]^{-1} x_{m/m'}(k'' + F - 1)$$

$$W = \begin{bmatrix} w_0 & & & 0 \\ & w_1 & & \\ & & \cdot & \\ & & & \cdot \\ 0 & & & w_{N-1} \end{bmatrix}$$

$$w_j \geq 0,\ 0 \leq j \leq N - 1$$

$$f1''_{m/m'}(k'') = [0\ f1'_{m/m'}(k'')]^t$$

$$\vdots$$

$$fF''_{m/m'}(k'') = [0\ fF'_{m/m'}(k'')]^t$$

$$f1_{m/m'}(k'') = W X_{m/m'}(k'' - 2)$$

$$[X_{m/m'}{}^t (k'' - 2)\ W X_{m/m'}(k'' - 2) + \delta I]^{-1} x_{m/m'}(k'')$$

$$f2_{m/m'}(k'') = W X_{m/m'}(k'' - 1)$$

$$[X_{m/m'}{}^t (k'' - 1)\ W X_{m/m'}(k'' - 1) + \delta I]^{-1} x_{m/m'}(k'' + 1)$$

$$\vdots$$

$$fF_{m/m'}(k'') = W X_{m/m'}(k'' + F - 3)$$

$$[X_{m/m'}{}^t (k'' + F - 3)\ W X_{m/m'}(k'' + F - 3) + \delta I]^{-1} x_{m/m'}(k'' + F - 1)$$

where $X_{m/m'}(k'')$ is an ideal received signal matrix for the transmission sequence candidate resulting from the branch from the state m' to the state m at the k''-th sampling time, $\delta$ is a positive infinitesimal constant, I is an L-dimensional unit matrix, $x_{m/m'}(k'')$ is an ideal received signal vector for the transmission sequence can-didate resulting from the branch from the state m' to the state m at the k''-th sampling time, and F is an integer greater than one.

11. An apparatus for estimating a maximum likelihood sequence in a digital communication receiver, comprising:

sampling means for sampling received signals at a predetermined sampling frequency;

first memory means for sequentially storing at least N of the received signals sampled for at least N previous sampling times by the sampling means, where N is an integer, for forming an N-dimensional received signal vector for a present sampling time;

second memory means for storing N-dimensional vectors corresponding to all possible transmission sequence candidates of a prescribed length L, which are pre-calculated according to a prescribed definition for defining the N-dimensional vectors;

calculation means for calculating an inner product of one of the N-dimensional vectors stored in the second memory means corresponding to each transmission sequence candidate resulting from each one of branches reaching to each state at the present sampling time with the N-dimensional received signal vector for the present sampling time stored in the first memory means to obtain an estimated received signal for said each one of the branches at the present sampling time; and means for estimating the maximum likelihood sequence as a survivor path for said each state at the present sampling time by selecting one of the branches reaching to said each state which minimizes a path metric defined as a cumulative value of a square of an absolute value of a difference between the estimated received signal for each sampling time up to the present sampling time calculated by the calculating means and an actual received signal for said each sampling time up to the present sampling time.

12. The apparatus of claim 11, wherein the second memory means stores the N-dimensional vectors defined by the prescribed definition expressed by:

$$g_{m/m'}(k) = s_{m'}(k-1)\ [s_{m'}{}^t (k-1)\ s_{m'}(k-1) + \delta I]^{-1} s_m(k)$$

where $g_{m/m'}(k)$ is an N-dimensional vector for a transmission sequence candidate resulting from a branch from a state m' to a state m at a k-th sampling time, $s_{m'}(k-1)$ is an N×L transmission signal matrix for the state m' at a (k−1)-th sampling time, $\delta$ is a positive infinitesimal constant, I is an L-dimensional unit matrix, and $s_m(k)$ is an L-dimensional transmission signal vector for the state m at the k-th sampling time.

13. The apparatus of claim 11, wherein the second memory means stores the N-dimensional vectors which are pre-calculated for a transmission path response for minimizing an evaluation function expressed by:

$$E(k) = \sum_{i=-N+1}^{0} |e_{k+i}|^2 + \delta\ h^t(k)\ h(k)$$

$$= [S(k)\ h(k) - r(k)]^t\ [S(k)\ h(k) - r(k)] + \delta\ h^t(k)\ h(k)$$

where $E'(k)$ is the evaluation function at a k-th sampling time, $e_{k+i}$ is given by:

$$e_{k+i} = s^t(k+i) h(k) - r_{k+i}$$

$s(k+i)$ is an L-dimensional transmission signal vector at a $(k+i)$-th sampling time, $h(k)$ is the transmission path response at the k-th sampling time, $r_{k+i}$ is a $(1-i)$-th element of the N-dimensional received signal vector at the k-th sampling time, $\delta$ is a positive infinitesimal constant, $S(k)$ is an $N \times L$ transmission signal matrix at the k-th sampling time, and $r(k)$ is the N-dimensional received signal vector at the k-th sampling time.

14. The apparatus of claim 11, wherein the sampling means uses the sampling frequency which is F times a transmission symbol frequency, where F is an integer greater than one.

15. The apparatus of claim 14, wherein the second memory means stores the N-dimensional vectors defined by the prescribed definition expressed by:

$$g1_{m/m'}(k'') = X_{m/m'}(k'' - 1)$$
$$[X_{m/m'}{}^t(k'' - 1) X_{m/m'}(k'' - 1) + \delta I]^{-1} x_{m/m'}(k'')$$

$$g2_{m/m'}(k'') = X_{m/m'}(k'')$$
$$[X_{m/m'}{}^t(k'') X_{m/m'}(k'') + \delta I]^{-1} x_{m/m'}(k'' + 1)$$

$$\vdots$$

$$gF_{m/m'}(k'') = X_{m/m'}(k'' + F - 2)$$
$$[X_{m/m'}{}^t(k'' + F - 2) X_{m/m'}(k'' + F - 2) + \delta I]^{-1} x_{m/m'}(k'' + F - 1)$$

where $g1_{m/m'}(k'')$ to $gF_{m/m'}(k'')$ are the N-dimensional vectors for a transmission sequence candidate resulting from a branch from a state m' to a state m at a k''-th sampling time, $X_{m/m'}(k'')$ is an ideal received signal matrix for the transmission sequence candidate resulting from the branch from the state m' to the state m at the k''-th sampling time, $\delta$ is a positive infinitesimal constant, I is an L-dimensional unit matrix, and $x_{m/m'}(k'')$ is an ideal received signal vector for the transmission sequence candidate resulting from the branch from the state m' to the state m at the k''-th sampling time.

16. The apparatus of claim 11, wherein each of the N-dimensional vectors stored in the second memory means includes a time weight factor.

17. The apparatus of claim 16, wherein the second memory means stores the N-dimensional vectors defined by the prescribed definition expressed by:

$$g1_{m/m'}(k'') = W X_{m/m'}(k'' - 1)$$
$$[X_{m/m'}{}^t(k'' - 1) W X_{m/m'}(k'' - 1) + \delta I]^{-1} x_{m/m'}(k'')$$

$$g2_{m/m'}(k'') = W X_{m/m'}(k'')$$
$$[X_{m/m'}{}^t(k'') X_{m/m'}(k'') + \delta I]^{-1} x_{m/m'}(k'' + 1)$$

$$\vdots$$

$$gF_{m/m'}(k'') = W X_{m/m'}(k'' + F - 2)$$
$$[X_{m/m'}{}^t(k'' + F - 2) W X_{m/m'}(k'' + F - 2) + \delta I]^{-1} x_{m/m'}(k'' + F - 1)$$

where $g1_{m/m'}(k'')$ to $gF_{m/m'}(k'')$ are the N-dimensional vectors for a transmission sequence candidate resulting from a branch from a state m' to a state m at a k''-th sampling time, F is an integer greater than one, W is the time weight factor given by:

$$W = \begin{bmatrix} w_0 & & & 0 \\ & w_1 & & \\ & & \cdot & \\ & & & \cdot \\ 0 & & & w_{N-1} \end{bmatrix}$$

$w_j \geq 0$, $0 \leq j \leq N-1$, $X_{m/m'}(k'')$ is an ideal received signal matrix for the transmission sequence candidate resulting from the branch from the state m' to the state m at the k''-th sampling time, $\delta$ is a positive infinitesimal constant, I is an L-dimensional unit matrix, and $x_{m/m'}(k'')$ is an ideal received signal vector for the transmission sequence candidate resulting from the branch from the state m' to the state m at the k''-th sampling time.

18. The apparatus of claim 11, wherein the second memory means stores the N-dimensional vectors which are pre-calculated for a transmission path response for minimizing an evaluation function expressed by:

$$E''(k) = \sum_{i=-N+1}^{0} w_{-i} |e_{k+i}|^2 + \delta h^t(k) h(k)$$

where $E''(k)$ is the evaluation function at a k-th sampling time, $w_{-i}$ is a $(-i)$-th time weight factor, $e_{k+i}$ is given by:

$$e_{k+i} = s^t(k+i) h(k) - r_{k+i}$$

$s(k+i)$ is an L-dimensional transmission signal vector at a $(k+i)$-th sampling time, $h(k)$ is the transmission path response at the k-th sampling time, $r_{k+i}$ is a $(1-i)$-th element of the N-dimensional received signal vector, and $\delta$ is a positive infinitesimal constant.

19. The apparatus of claim 11, wherein the second memory means stores the N-dimensional vectors which are pre-calculated for a transmission path response expressed by:

$$h(k) = h(k-1) + \alpha \{h(k-1) - h(k-2)\}$$
$$= \{1 + \alpha\} h(k-1) - \alpha h(k-2)$$

where $h(k)$ is the transmission path response at a k-th sampling time, and $\alpha$ is a positive constant.

20. The apparatus of claim 11, wherein the second memory means stores the N-dimensional vectors defined by the prescribed definition expressed by:

$$d1_{m/m'}(k'') = (1 + \alpha) g1''_{m/m'}(k'') - \alpha f1''_{m/m'}(k'')$$

$$\vdots$$

$$dF_{m/m'}(k'') = (1 + \alpha) gF''_{m/m'}(k'') - \alpha fF''_{m/m'}(k'')$$

where $d1_{m/m'}(k'')$ to $dF_{m/m'}(k'')$ are the N-dimensional vectors for a transmission sequence candidate resulting from a branch from a state m' to a state m at a k''-th sampling time, $\alpha$ is a positive constant and $g1''_{m/m'}(k'')$ to $gF''_{m/m'}(k'')$ and $f1''_{m/m'}(k'')$ to $fF''_{m/m'}(k'')$ are given by:

$$g1''_{m/m'}(k'') = [g1'_{m/m'}(k'')\ 0]^t$$

$$\vdots$$

$$gF''_{m/m'}(k'') = [gF'_{m/m'}(k'')\ 0]^t$$

$$g1_{m/m'}(k'') = W X_{m/m'}(k''-1)$$
$$[X_{m/m'}^t(k''-1) W X_{m/m'}(k''-1) + \delta I]^{-1} x_{m/m'}(k'')$$

$$g2_{m/m'}(k'') = W X_{m/m'}(k'')$$
$$[X_{m/m'}^t(k'') X_{m/m'}(k'') + \delta I]^{-1} x_{m/m'}(k''+1)$$

$$\vdots$$

$$gF_{m/m'}(k'') = W X_{m/m'}(k''+F-2)$$
$$[X_{m/m'}^t(k''+F-2) W X_{m/m'}(k''+F-2) + \delta I]^{-1} x_{m/m'}(k''+F-1)$$

$$W = \begin{bmatrix} w_0 & & & 0 \\ & w_1 & & \\ & & \ddots & \\ 0 & & & w_{N-1} \end{bmatrix}$$

$$w_j \geq 0,\ 0 \leq j \leq N-1$$

-continued $$f1''_{m/m'}(k'') = [0\ f1'_{m/m'}(k'')]^t$$

$$\vdots$$

$$fF''_{m/m'}(k'') = [0\ fF'_{m/m'}(k'')]^t$$

$$f1_{m/m'}(k'') = W X_{m/m'}(k''-2)$$
$$[X_{m/m'}^t(k''-2) W X_{m/m'}(k''-2) + \delta I]^{-1} x_{m/m'}(k'')$$

$$f2_{m/m'}(k'') = W X_{m/m'}(k''-1)$$
$$[X_{m/m'}^t(k''-1) W X_{m/m'}(k''-1) + \delta I]^{-1} x_{m/m'}(k''+1)$$

$$\vdots$$

$$fF_{m/m'}(k'') = W X_{m/m'}(k''+F-3)$$
$$[X_{m/m'}^t(k''+F-3) W X_{m/m'}(k''+F-3) + \delta I]^{-1} x_{m/m'}(k''+F-1)$$

where $X_{m/m'}(k'')$ is an ideal received signal matrix for the transmission sequence candidate resulting from the branch from the state m' to the state m at the k''-th sampling time, $\delta$ is a positive infinitesimal constant, I is an L-dimensional unit matrix, $x_{m/m'}(k'')$ is an ideal received signal vector for the transmission sequence candidate resulting from the branch from the state m' to the state m at the k''-th sampling time, and F is an integer greater than one.

* * * * *